United States Patent
Sandstrom et al.

(10) Patent No.: US 11,664,321 B2
(45) Date of Patent: May 30, 2023

(54) MULTI-STEP HIGH ASPECT RATIO VERTICAL INTERCONNECT AND METHOD OF MAKING THE SAME

(71) Applicant: Deca Technologies USA, Inc., Tempe, AZ (US)

(72) Inventors: Clifford Sandstrom, Richfield, MN (US); Craig Bishop, Scottsdale, AZ (US); Timothy L. Olson, Phoenix, AZ (US)

(73) Assignee: Deca Technologies USA, Inc., Tempe, AZ (US)

( * ) Notice: Subject to any disclaimer, the term of this patent is extended or adjusted under 35 U.S.C. 154(b) by 0 days.

(21) Appl. No.: 17/590,227

(22) Filed: Feb. 1, 2022

(65) Prior Publication Data

US 2022/0246532 A1     Aug. 4, 2022

Related U.S. Application Data

(60) Provisional application No. 63/144,838, filed on Feb. 2, 2021.

(51) Int. Cl.

| | |
|---|---|
| *H01L 23/538* | (2006.01) |
| *H01L 23/00* | (2006.01) |
| *H01L 23/31* | (2006.01) |
| *H01L 21/683* | (2006.01) |
| *H01L 21/48* | (2006.01) |
| *H01L 21/56* | (2006.01) |

(52) U.S. Cl.
CPC ...... *H01L 23/5386* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5389* (2013.01); *H01L 24/19* (2013.01); *H01L 24/20* (2013.01); *H01L 2221/68372* (2013.01); *H01L 2224/214* (2013.01)

(58) Field of Classification Search
None
See application file for complete search history.

(56) References Cited

U.S. PATENT DOCUMENTS

| | | | | |
|---|---|---|---|---|
| 5,367,764 A | * | 11/1994 | DiStefano | ........... H01L 23/5383 |
| | | | | 174/262 |
| 2017/0133309 A1 | * | 5/2017 | Kim | ........................ H01L 24/19 |

* cited by examiner

*Primary Examiner* — Jay C Chang
(74) *Attorney, Agent, or Firm* — Booth Udall Fuller, PLC; Bryce W. Burnham

(57) ABSTRACT

A multi-step conductive interconnect (MSI) may comprise a first step of the MSI comprising a first end and a second end opposite the first end, a first height (Ha) and a first diameter (Da). A second step of the MSI may comprise a first end and a second end opposite the first end. The first end of the second step contacts the second end of the first step. The second step may comprise a second height (Hb) and a second diameter (Db). The MSI may comprise a height (H) and a height to width aspect ratio (H:Da) greater than or equal to 1.5:1. A sidewall of the first step may comprise an offset (O) with respect to a sidewall of the second step to form a disjointed sidewall profile. The offset O may be in a range of 0.1 μm-20 μm.

19 Claims, 11 Drawing Sheets

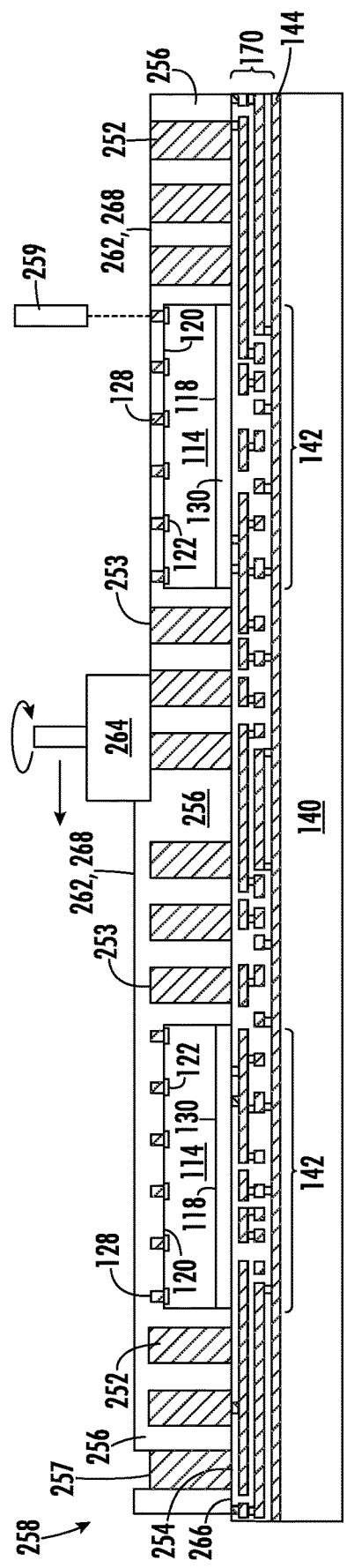

MULTI-STEP HIGH ASPECT RATIO VERTICAL INTERCONNECT AND METHOD OF MAKING THE SAME

CROSS-REFERENCE TO RELATED APPLICATIONS

This disclosure claims the benefit, including the filing date, of U.S. Provisional Patent No. 63/144,838, entitled "Multi-Step High Aspect Ratio Vertical Interconnect and Method of Making the Same," which was filed on Feb. 2, 2021, the disclosure of which is hereby incorporated herein by this reference.

TECHNICAL FIELD

This disclosure relates to a multi-step high aspect ratio vertical interconnect and methods of making the same.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, memories, analog to digital or digital to analog converters, power management and charged-coupled devices (CCDs), as well as microelectromechanical systems (MEMS) devices including digital micro-mirror devices (DMDs).

Semiconductor devices perform a wide range of functions such as signal processing, high-speed calculations, transmitting and receiving electromagnetic signals, controlling electronic devices, storing information, and creating visual projections for displays. Semiconductor devices are found in many fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar, complementary metal oxide semiconductors, and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. More recently, back-end manufacturing has been expanded to included emerging technology that allows multiple semiconductor die to be interconnected within a single package or device unit, thereby expanding the conventional definition of back-end technology. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, can be produced more efficiently, have a smaller form factor, and may be less cumbersome when integrated within wearable electronics, portable handheld communication devices, such as phones, and in other applications. In other words, smaller semiconductor devices may have a smaller footprint, a reduced height, or both, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY

An opportunity exists for improved semiconductor manufacturing, packaging, and devices. Accordingly, in an aspect of the disclosure, a semiconductor device may comprise a multi-step conductive interconnect (MSI), comprising a first step and a second step. The first step of the MSI may comprise a first end and a second end opposite the first end. The first end is coupled to a first build-up interconnect structure, the first step comprising a first height (Ha) defined by a distance between the first end of the first step and the second end of the first step and the first step further comprising a first diameter (Da) perpendicular to the first height Ha. The second step of the MSI may comprise a first end and a second end opposite the first end. The first end of the second step contacts the second end of the first step and the second end of the second step contacts a second build-up interconnect structure. The second step comprising a second height (Hb) defined by a distance between the first end of the second step and the second end of the second step and the second step further comprising a second diameter (Db) perpendicular to the second height Hb. The MSI comprises a height (H) that is a sum of the first step height Ha and the second step height Hb. The MSI comprises a height:width aspect ratio (H:Da) greater than or equal to 1.5:1. A sidewall of the first step comprises as offset (0) with respect to a sidewall of the second step at an interface between the second surface of the first step and the first surface of the second step. The offset forms a disjointed sidewall profile, wherein the offset O is in a range of 0.1 μm-20 μm.

Particular embodiments of the MSI may further comprise the first diameter Da comprising a distance in a range of 25-100 μm and spacing between the MSI and a proximately adjacent MSI at a distance of 25-100 μm to form a pitch between MSI of 50-400 μm. At least one more step may be formed over and coupled to the second end of the second step. a grain of a conductive material of the first step may be mismatched with a grain of a conductive material of the second step. A first redistribution layer (RDL) in the first build-up interconnect structure may comprise a first pitch, and a second RDL in the second build-up interconnect structure may comprise second pitch that is at least 10 μm less than the first pitch. The height H of the MSI may be in a range of 50-300 μm and the diameter Da may be in a range of 25-100 μm.

According to an aspect of the disclosure, a MSI may comprise a first step of the MSI comprising a first end and a second end opposite the first end, a first height and a first diameter. A second step of the MSI may comprise a first end and a second end opposite the first end. The first end of the second step contacts the second end of the first step. The second step may comprise a second height and a second diameter. The MSI may comprise a height and a height to width aspect ratio greater than or equal to 1.5:1. A sidewall of the first step may comprise an offset with respect to a sidewall of the second step to form a disjointed sidewall profile. The offset may be in a range of 0.1 μm-20 μm.

In another aspect, particular embodiments of the semiconductor device may comprise the first diameter comprising a distance in a range of 25-200 μm and spacing between the MSI and a proximately adjacent MSI at a distance of 25-200 μm to form a pitch between MSI of 50-400 μm. At least one more step may be formed over and coupled to the second end of the second step. A grain of the conductive material of the first step may be mismatched with a grain of a conductive material of the second step. A first RDL may comprise a first pitch and be coupled to the first step, and a second RDL may comprise a second pitch that is at least 10 μm less than the first pitch, the second RDL being coupled with the second step. The height H of the MSI may be in a range of 50-300 μm, and the diameter Da may be in a range of 25-100 μm. The diameter Db of the second step may be less than or equal to half the diameter Da of the first step.

According to an aspect of the disclosure, a method of making multi-step conductive interconnects may comprise providing a substrate and forming a first build-up interconnect structure over the substrate. A first layer of photoresist material may be disposed over the first build-up interconnect structure and first openings may be formed in the first layer of photoresist material. First steps of the MSIs may be formed by disposing conductive material within the first openings in the first layer of photoresist material. A second layer of photoresist material may be disposed over the first layer of photoresist material and over the first steps of the MSIs and openings may be formed in the second layer of photoresist material aligned with the first steps of the MSIs. Second steps of the MSIs may be formed by disposing conductive material within the second openings in the second layer of photoresist material. The first layer of photoresist material and the second layer of photoresist material may be removed after having formed both the first steps and the second steps of the MSIs.

In another aspect, particular embodiments of the method of making a semiconductor device may comprise forming multiple layers of photoresist material to reduce the aspect ratio of the openings formed in the first layer of photoresist material and the second layer of photoresist material to improve imaging capability for openings in the first layer of photoresist material and the second layer of photoresist material. A first RDL in the first build-up interconnect structure may be formed at first pitch, and a second build-up interconnect structure over the MSIs may be formed opposite the first build-up interconnect structure. The second build-up interconnect structure may comprise a second RDL that comprises a second pitch at least 10 μm less than the first pitch. The multi-step conductive interconnect may comprise a height to width aspect ratio (H:Da) greater than or equal to 1.5:1. The MSI may comprise a disjointed sidewall profile between the first step and the second step with an offset in a range of 0.1 μm-20 μm. The MSI may be formed to a height of at least 50 μm; and an upper portion of the conductive interconnects may be ground to a finished height. The second step of the MSI may comprise a diameter that is less than or equal to half a diameter of the first step of the conductive interconnect.

The foregoing and other aspects, features, applications, and advantages will be apparent to those of ordinary skill in the art from the specification, drawings, and the claims. Unless specifically noted, it is intended that the words and phrases in the specification and the claims be given their plain, ordinary, and accustomed meaning to those of ordinary skill in the applicable arts. The inventors are fully aware that he can be his own lexicographer if desired. The inventors expressly elect, as their own lexicographers, to use only the plain and ordinary meaning of terms in the specification and claims unless they clearly state otherwise and then further, expressly set forth the "special" definition of that term and explain how it differs from the plain and ordinary meaning. Absent such clear statements of intent to apply a "special" definition, it is the inventors' intent and desire that the simple, plain and ordinary meaning to the terms be applied to the interpretation of the specification and claims.

The inventors are also aware of the normal precepts of English grammar. Thus, if a noun, term, or phrase is intended to be further characterized, specified, or narrowed in some way, then such noun, term, or phrase will expressly include additional adjectives, descriptive terms, or other modifiers in accordance with the normal precepts of English grammar. Absent the use of such adjectives, descriptive terms, or modifiers, it is the intent that such nouns, terms, or phrases be given their plain, and ordinary English meaning to those skilled in the applicable arts as set forth above.

Further, the inventors are fully informed of the standards and application of the special provisions of 35 U.S.C. § 112(f). Thus, the use of the words "function," "means" or "step" in the Detailed Description or Description of the Drawings or claims is not intended to somehow indicate a desire to invoke the special provisions of 35 U.S.C. § 112(f), to define the invention. To the contrary, if the provisions of 35 U.S.C. § 112(f) are sought to be invoked to define the inventions, the claims will specifically and expressly state the exact phrases "means for" or "step for", and will also recite the word "function" (i.e., will state "means for performing the function of [insert function]"), without also reciting in such phrases any structure, material or act in support of the function. Thus, even when the claims recite a "means for performing the function of . . . " or "step for performing the function of . . . ," if the claims also recite any structure, material or acts in support of that means or step, or that perform the recited function, then it is the clear intention of the inventors not to invoke the provisions of 35 U.S.C. § 112(f). Moreover, even if the provisions of 35 U.S.C. § 112(f) are invoked to define the claimed aspects, it is intended that these aspects not be limited only to the specific structure, material or acts that are described in the preferred embodiments, but in addition, include any and all structures, materials or acts that perform the claimed function as described in alternative embodiments or forms of the disclosure, or that are well known present or later-developed, equivalent structures, material or acts for performing the claimed function.

The foregoing and other aspects, features, and advantages will be apparent to those of ordinary skill in the art from the specification, drawings, and the claims.

BRIEF DESCRIPTION OF THE DRAWINGS

FIGS. 2A-2I illustrate the formation of MSI as part of a semiconductor device.

DETAILED DESCRIPTION

Figure 1A:
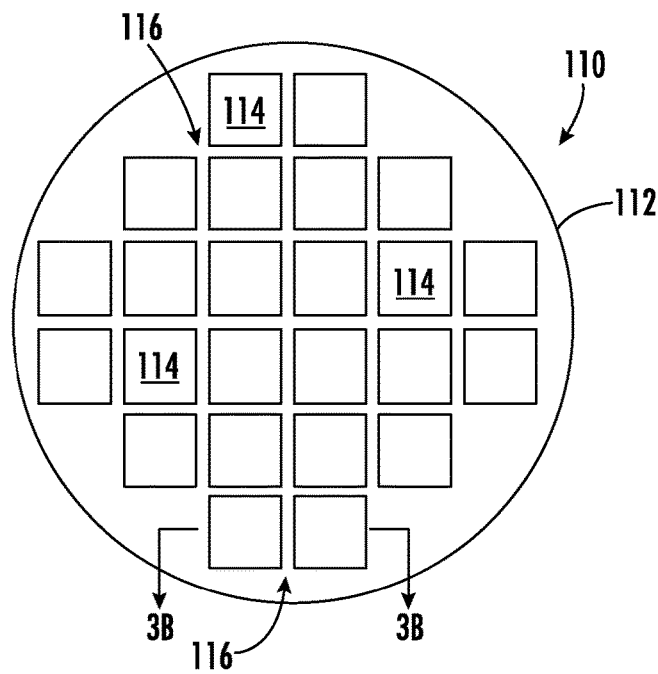
FIGS. 1A-1C illustrate a semiconductor die comprising electrical interconnects being singulated from a native wafer.

This disclosure relates to various elements or steps for a method of making MSI and various structure resulting from the same. This disclosure, its aspects and implementations, are not limited to the specific package types, material types, or other system component examples, or methods disclosed herein. Many additional components, manufacturing and assembly procedures known in the art consistent with semiconductor manufacture and packaging are contemplated for use with particular implementations from this disclosure. Accordingly, for example, although particular implementations are disclosed, such implementations and implementing components may comprise any components, models, types, materials, versions, quantities, and/or the like as is known in the art for such systems and implementing components, consistent with the intended operation.

The word "exemplary," "example" or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of varying scope could have been presented, but have been omitted for purposes of brevity.

Where the following examples, embodiments and implementations reference examples, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, such as by a stripping process, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the photoresist material are partially removed, so as to provide a pattern or electroplating template for the subsequent formation of structures, such as patterning RDLs, under bump mentalization (UBM), copper posts, vertical interconnects, or other desirable structures. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle, masks, or direct write imaging design file are transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes or electroplating adds the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed by etching or a layer is added by electroplating. The process of forming, exposing, and removing the photoresist, as well as the process of removing or adding a portion of the semiconductor wafer can be modified according to the particular resist used and the desired results. Negative or positive tones resist can be designed for solvent or base develop solutions.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or base developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent or a base in the development process. The basic positive photoresist polymer is the phenol-formaldehyde polymer, also called the phenol-formaldehyde novolak resin. Removing the soluble portions (i.e. the portions exposed to light) with chemical solvents or base developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface can be beneficial or required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. Alternatively, mechanical abrasion without the use of corrosive chemicals is used for planarization. In some embodiments, purely mechanical abrasion is achieved by using a belt grinding machine, a standard wafer backgrinder, or other similar machine. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer can be cut along non-functional regions of the wafer called saw streets or scribes. The wafer is singulated using a laser cutting tool, laser silicon lattice disruption process or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, redistribution layers, or wirebonds. An encapsulant or other molding material is deposited over the package to provide physical support and electrical isolation. The finished package is then inserted into an electrical system and the functionality of the semiconductor device is made available to the other system components.

Back-end manufacturing as disclosed herein also does more than merely packaging an embedded device or the semiconductor die for structural support and environmental isolation. The packaging described herein further provides non-monolithic electrical interconnection of die for increased functionality & performance. Previously, nearly all advanced semiconductor die were monolithic systems on chips (SoCs) where all electrical interconnect occurred on the silicon wafer during front-end processing. Now, however, work that was traditionally the domain of front-end domain work may be handled or moved to the back-end manufacturing, allowing many semiconductor die (chiplets) to be connected with packaging technology to form a chiplet-based SoC (which is non monolithic) and provides a composite package with greater functionality. The chiplet approach may also decrease waste from defects, increase production efficiency, reliability, and performance.

The electrical system can be a stand-alone system that uses the semiconductor device to perform one or more electrical functions. Alternatively, the electrical system can be a subcomponent of a larger system. For example, the electrical system can be part of a portable hand-held electronic device, such as smart phone, a wearable electronic device, or other video or electronic communication device. Additionally, the electrical system may comprise a graphics component, network interface component, or other signal processing component that can be inserted into a computer or electronics device and may assist with such functions as mobile computing, artificial intelligence, and autonomous functions such as autonomous driving. The semiconductor package can include microprocessors, memories, application specific integrated circuits (ASIC), logic circuits, analog circuits, RF circuits, discrete devices, or other semiconductor die or electrical components. Miniaturization and weight reduction can be beneficial or essential for the products to be accepted by the market. The distance between semiconductor devices must be decreased to achieve higher density.

By combining one or more semiconductor devices, structures, or packages with fan-out technology, manufacturers can incorporate multiple components or elements into more highly compact and integrated electronic devices and systems. Because the semiconductor devices include sophisticated functionality, electronic devices can be manufactured less expensively and as part of a streamlined manufacturing process. The resulting devices are less likely to fail and less expensive to manufacture resulting in a lower cost for consumers.

Figure 1B:
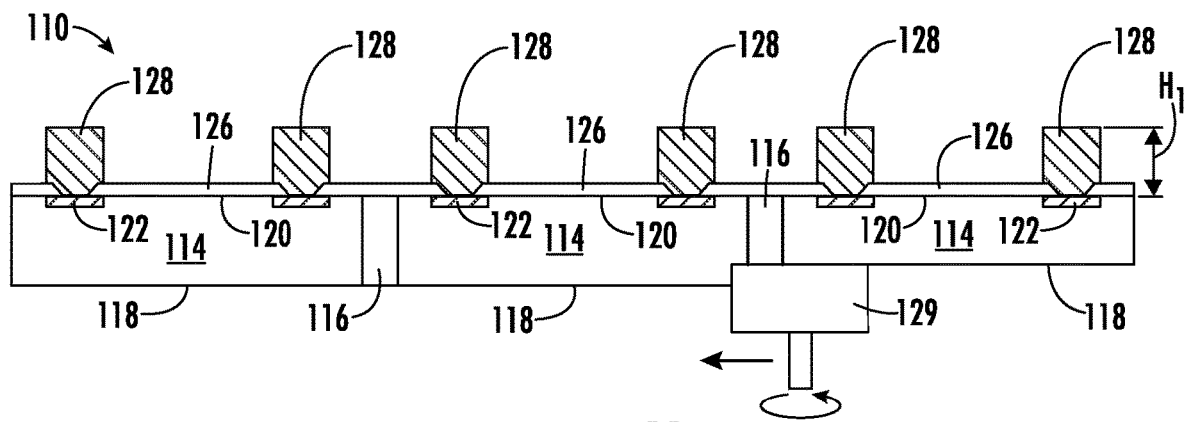
Figure 1C:
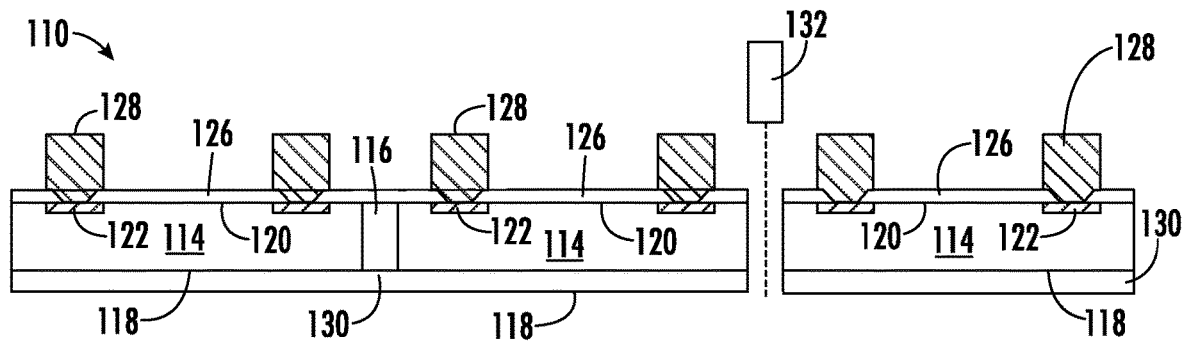

FIGS. 1A-1C show various views of a semiconductor wafer 110 and the formation and separation of individual semiconductor die 114 therefrom. FIG. 1A illustrates a plan view of a semiconductor wafer or native wafer 110 with a base substrate material 112, such as, without limitation, silicon, germanium, gallium arsenide, indium phosphide, or silicon carbide, for structural support. A plurality of semiconductor die or components 114 can be formed on wafer 110 separated by a non-active, inter-die wafer area or saw street 116 as described above. The saw street 116 can provide cutting areas to singulate the semiconductor wafer 110 into the individual semiconductor die 114.

Each semiconductor die 114 may comprise a backside or back surface 118 and an active surface 120 opposite the backside 118. The active surface 120 may contain analog or digital circuits implemented as active devices, passive devices, conductive layers, and dielectric layers formed within the die and electrically interconnected according to the electrical design and function of the semiconductor die 114. For example, the circuit may include one or more transistors, diodes, and other circuit elements formed within active surface to implement analog circuits or digital circuits, such as DSP, ASIC, memory, or other signal processing circuits. The semiconductor die 114 may also contain IPDs such as inductors, capacitors, and resistors, such as for power management, RF signal processing, and clocking or other functions. The semiconductor die 114 may be formed on a native wafer in a wafer level process as one of many packages being formed simultaneously on a carrier. In other instances, the semiconductor die 114 may be formed as part of a reconstituted wafer, and may comprise multiple die molded together. The semiconductor die 114 may also be another suitable embedded device, which may be subsequently formed within a semiconductor device or molded interposer 300, and surrounded (partially or entirely) by encapsulant 256. The semiconductor die 114 within the semiconductor device 300 may be an active die, a bridge die, and in other instances may be formed without an active surface, and with copper studs of the bridge die electrically connected or coupled with wiring, routing, or RDLs.

FIG. 1B. illustrates a cross sectional sideview of the wafer 110, as shown taken along the section line 1B-1B in FIG. 1A. FIG. 1B also illustrates an optional dielectric, insulating, or passivation layer 126 conformally applied over the active surface 120 and over conductive layer 122. Insulating layer 126 can include one or more layers that are applied using PVD, CVD, screen printing, spin coating, spray coating, slot coating, slit coating, sintering, thermal oxidation, or other suitable process. Insulating layer 126 can contain, without limitation, one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), polymer, polyimide, benzocyclobutene (BCB), polybenzoxazoles (PBO), or other material having similar insulating and structural properties. Alternatively, semiconductor die 114 are packaged without the use of any PBO layers, and insulating layer 126 can be formed of a different material or omitted entirely. In another embodiment, insulating layer 126 includes a passivation layer formed over the active surface 120 without being disposed over conductive layer 122. When insulating layer 126 is present and formed over conductive layer 122, openings are formed completely through insulating layer 126 to expose at least a portion of conductive layer 122 for subsequent mechanical and electrical interconnection. Alternatively, when insulating layer 126 is omitted, conductive layer 122 is exposed for subsequent electrical interconnection without the formation of openings.

FIG. 1B also illustrates conductive bumps, conductive interconnects, or electrical interconnect structures 128 that can be formed as columns, pillars, posts, thick RDLs, bumps, or studs that are formed of copper or other suitable conductive material, which are disposed over, and coupled or connected to, conductive layer 122. When formed as posts 128, the posts will have a height greater than a thickness, whereas a pillar has a tin cap and a stud is wider than it is tall. Conductive bumps 128 can be formed directly on conductive layer 122 using patterning and metal deposition processes such as printing, PVD, CVD, sputtering, electrolytic plating, electroless plating, metal evaporation, metal sputtering, or other suitable metal deposition process. Conductive bumps 128 can be one or more layers of Al, Cu, Sn, Ni, Au, Ag, palladium (Pd), or other suitable electrically conductive material and can include one or more layers. In some instances, one or more UBM layers of Al, Cu, Sn, Ni, Au, Ag, Pd, or other suitable electrically conductive material can optionally be disposed between conductive layer 122 and conductive bumps 128. In some embodiments, conductive bumps 128 can be formed by depositing a photoresist layer over the semiconductor die 114 and conductive layer 122 while the semiconductor die 114 are part of the semiconductor wafer 110. A portion of the photoresist layer can be exposed and removed by an etching development process, and the conductive bumps 128 can be formed as copper pillars in the removed portion of the photoresist and over conductive layer 122 using a selective plating process. The photoresist layer can be removed leaving conductive bumps 128 that provide for subsequent mechanical and electrical interconnection and a standoff with respect to active surface 120. Conductive bumps 128 can include a height H1 in a range of 5-100 micrometers (μm) or a height in a range of 20-50 μm, or a height of about 25 μm. As used herein, "thereabout," "about," or "substantially" means a percent difference in a range of 0-5%, 1-10%, 1-20%, 1-30%, or 1-50% of the number or range indicated.

FIG. 1B also illustrates the semiconductor wafer 110 can undergo an optional grinding operation with a grinder 129 to planarize the surface and reduce a thickness of the semiconductor wafer 110. A chemical etch can also be used to remove and planarize a portion of the semiconductor wafer 110. While FIG. 1B illustrates each semiconductor die 114 with 2 representative conductive studs 128, any desirable number of conductive studs 128 may be formed, and FIG. 2H shows 6 representative conductive studs in the profile view of semiconductor die 114.

FIG. 1C illustrates attaching a die attach film (DAF) 130 to the semiconductor wafer 110 that can be disposed over, and in direct contact with, the backsides 118 of the semiconductor die 114. The DAF 130 can comprise epoxy, thermal epoxy, epoxy resin, B-stage epoxy laminating film, ultraviolet (UV) B-stage film adhesive layer, UV B-stage film adhesive layer including acrylic polymer, thermo-setting adhesive film layer, a suitable wafer backside coating, epoxy resin with organic filler, silica filler, or polymer filler, acrylate based adhesive, epoxy-acrylate adhesive, a polyimide (PI) based adhesive, or other adhesive material.

FIG. 1C also illustrates semiconductor wafer 110 can be singulated through gaps or saw streets 116 using laser grooving, a saw blade or laser cutting tool 132, or both to singulate the semiconductor wafer 110 into individual semiconductor die 114 with conductive bumps 128. The semiconductor die 114 can then be used as part of a subsequently formed semiconductor component package as discussed in greater detail below with respect to FIGS. 2A-5D.

Figure 2A:
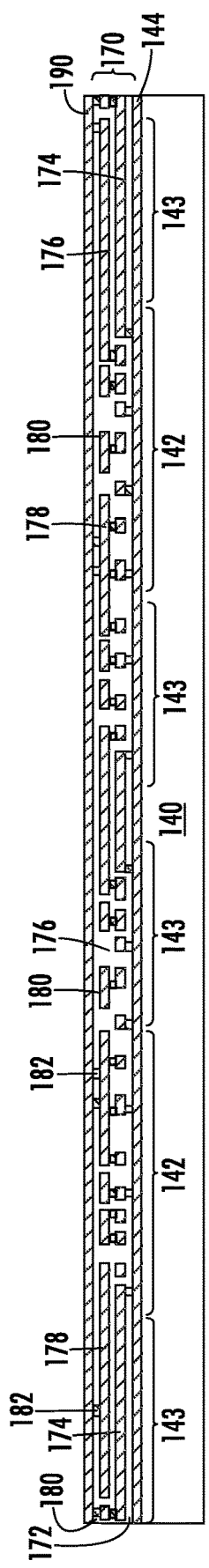

FIG. 2A illustrates providing a temporary carrier or substrate 140, on which subsequent processing of semiconductor device 300 can occur, as described in greater detail herein. Carrier 140 may be a temporary or sacrificial carrier or substrate, and in other instances may be or a reusable carrier or substrate. The carrier 140 may be of any desirable or suitable size, including a circular shape comprising a diameter of 300 mm.

The carrier 140 can contain one or more base materials formed in one or more layers, which may comprise base materials such as metal, silicon, polymer, polymer composite, ceramic, perforated ceramic, glass, glass epoxy, stainless steel, mold compound, mold compound with filler, or other suitable low-cost, rigid material or bulk semiconductor material for structural support. When a UV release is used with a temporary carrier 140, the carrier 140 may comprise one or more transparent or translucent materials, such as glass. When a thermal release is used with a temporary carrier 140, the carrier 140 may comprise opaque materials. The carrier 140 can be circular, square, rectangular, or other suitable or desirable shape and can include any desirable size, such as a size equal to, similar to, or slightly larger or smaller than a reconstituted wafer or panel that is subsequently formed on or over the carrier 140. In some instances, a diameter, length, or width of the temporary carrier can be equal to, or about, 200 millimeters (mm), 300 mm, or more.

The carrier 140 can comprise a plurality of semiconductor die mounting sites or die attach areas 142 spaced or disposed across a surface of the carrier 140, according to a design and configuration of the semiconductor device 300, to provide a peripheral area or space 143. The peripheral area 143 can partially or completely surround the die attach areas 142 to provide space for subsequent vertical, through package interconnections, and an area for fan-out routing or build-up interconnect structures. For example, the peripheral area 143 can surround, or be offset from, one side of the semiconductor die 114, or more than one side of the semiconductor die 114, such as 2, 3, 4, or more sides of the semiconductor die 114.

When a temporary carrier 140 is used, an optional release layer, interface layer or double-sided tape 144 can be formed over carrier 140 as a temporary adhesive bonding film or etch-stop layer. The release layer 144 may be a film or laminate, and may also be applied by spin coating, slot coating, slit coating, or other suitable process. The temporary carrier can be subsequently removed by strip etching, chemical etching, mechanical peel-off, CMP, plasma etching, thermal, light releasing process, mechanical grinding, thermal bake, laser scanning, UV light, or wet stripping.

FIG. 2A further illustrates forming a build-up interconnect structure 170 over the carrier 140 to electrically connect, and provide routing between, multi-step high aspect ratio vertical interconnects, multi-step vertical conductive interconnects, or multi-step interconnects, including columns, posts, and studs (hereinafter "MSI") 252, the conductive bumps 128, and other devices mounted on, or coupled with, the semiconductor device 300. While the build-up interconnect structure 170 is shown comprising three conductive layers and three insulating layer, a person of ordinary skill in the art will appreciate that fewer layers or more layers can be used depending on the configuration and design of the semiconductor device 300. The build-up interconnect structure 170 can optionally comprise a first insulating or passivation layer 172 formed or disposed over the carrier 140. The first insulating layer 172 can comprise one or more layers of $SiO_2$, $Si_3N_4$, SiON, $Ta_2O_5$, $Al_2O_3$, polymer, polyimide, BCB, PBO, or other material having similar insulating and structural properties. The insulating layer 172 can be formed using PVD, CVD, printing, spin coating, spray coating, slot coating, slit coating, sintering or thermal oxidation. Openings or first level conductive vias can be formed through the insulating layer 172 for subsequent interconnection with bumps, similar to bumps 296.

A first conductive layer 174 can be formed over the substrate 140 and over the first insulating layer 172 as a first RDL layer to extend through the openings in the first insulating layer 172, to electrically connect with the first level conductive vias, and to electrically connect with the conductive bumps 128 and the MSI 252. Conductive layer 174 can be one or more layers of Al, Cu, Sn, Ni, Au, Ag, or other suitable electrically conductive material formed using a patterning and metal deposition process such as sputtering, electrolytic plating, and electroless plating, or other suitable process.

A second insulating or passivation layer 176, which can be similar or identical to the first insulating layer 172, can be disposed or formed over the substrate 140, the first conductive layer 174, and the first insulating layer 172. An opening or second level conductive via can be formed through the second insulating layer 176 to connect with the first conductive layer 174.

A second conductive layer 178, when desirable and when present, may be similar or identical to the first conductive layer 174, can be formed as a second RDL layer over substrate 140, over the first insulating layer 172, over the first conductive layer 174, over the second level conductive via, or within an opening of the second insulating layer 172, to electrically connect with the first conductive layer 174, the first level and second level conductive vias, and the semiconductor die 114.

A third insulating or passivation layer 180, when desirable and when present, may be similar or identical to the first insulating layer 172, can be disposed or formed over the second conductive layer 178 and the second insulating layer 176. An opening or a third level conductive via can also be formed in or through the third insulating layer 280 to connect with the second conductive layer 178.

A third conductive layer 182, when desirable and when present, may be similar or identical to the second conductive layer 178, can be formed as a third RDL layer—or as vias or vertical interconnects through the third insulating layer 180—and further disposed over the second insulating layer 176, over the second conductive layer 178, over the second level conductive via, or within an opening of the second insulating layer 176, to electrically connect with the second conductive layer 178, and the semiconductor die 114.

FIG. 2A further illustrates forming a seed layer 190 over the build-up interconnect structure 170. The seed layer 190 can be one or more layers of Al, Cu, Sn, Ni, Au, Ag, Titanium (Ti), Tungsten (W) or other suitable electrically conductive material. In some instances, the seed layer 190 will be, or may include, Ti/Cu, TiW/Cu, W/Cu or a coupling agent/Cu. The formation, placement, or deposition of the seed layer 190 can be with PVD, CVD, electrolytic plating, electroless plating, or other suitable process. The seed layer 190 can be deposited by sputtering, electroless plating, or by depositing laminated foil, such as Cu foil, combined with electroless plating. The seed layer 190 may be used in subsequently plating or forming the MSI 252.

Figure 2B:
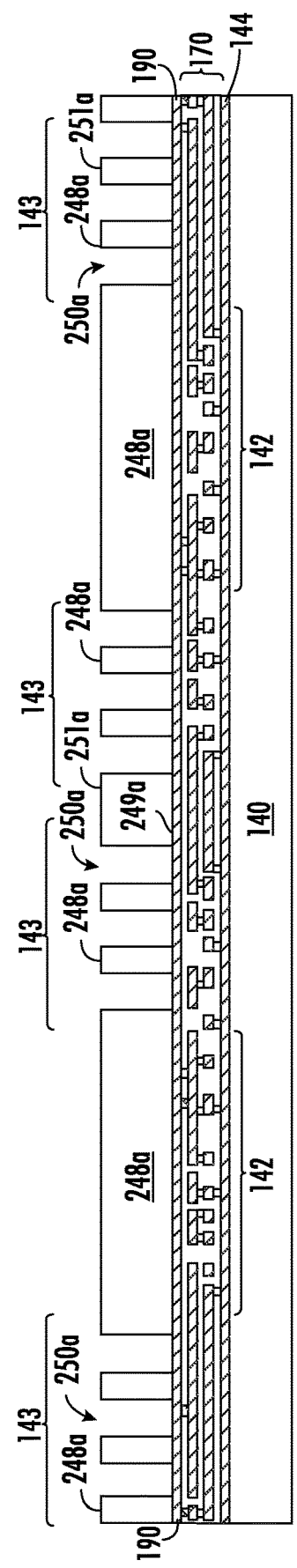

FIG. 2B illustrates forming or depositing a resist layer, dry film, or photosensitive layer 248 that may be a first resist or photoresist layer 248a over and directly contacting seed layer 190, over build-up interconnect structure 170, and over the temporary carrier 140. The photosensitive layer 248, may include for example, Showa Denko (Hitachi Chem) HM 4000 series photosensitive films, including HM-40112, depending on dimensions desired. In some instances, a thickness of the photosensitive layer 248 may be in a range of 80-140 μm, or about 110 μm to form a first step 252a or part of conductive posts, copper posts, conductive interconnect, or MSI 252.

After formation of the resist layer 248a over the temporary carrier 140, the resist layer 248a can then be exposed and developed to form openings 250a in the resist layer 248a. In some instances, more than one photoresist layer 248 may be used. Openings 250a may be formed in the photoresist 248a, and can be positioned over, or within a footprint of, the peripheral area 143 of the carrier 140. The openings 250a can extend completely through the resist layer 248a, such as from a first surface or bottom surface 249a of the resist layer 248a to second surface or top surface 251a of the resist layer 248a opposite the first surface 249a. A diameter or cross-sectional width Da of the MSI 252 (as well as the opening 250a for the MSI 252a) may be 60-120 μm or about 80 μm. A space or pitch between the MSI 252 may be the same or about the same as the diameter Da of the MSI 252, such as 60-120 μm or about 70 μm. An after-development inspection (ADI) of the developed resist layer 248a and the openings 250a can be performed to detect the condition or quality of the openings 250a. After the ADI of resist layer 248a and openings 250a, a descum operation can be performed on the developed resist layer 248a.

Figure 2C:
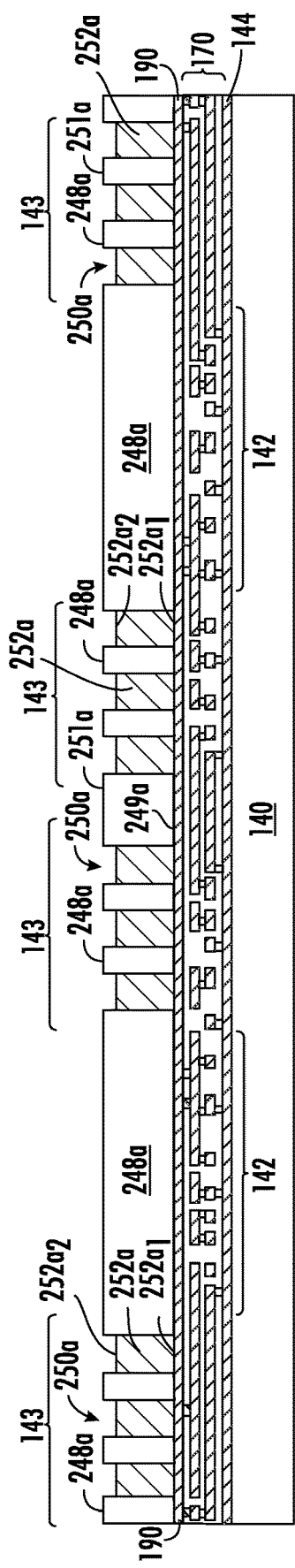

FIG. 2C illustrates forming a first step or portion 252a of the MSI 252 by disposing conductive material within the first openings 250a in the first layer of photoresist material 248a. The first step 252a of the MSI 252 can be formed as columns, pillars, posts, bumps, or studs. The conductive material for the first steps 252a of conducive post or MSI 252 may be Al, Cu, Sn, Ni, Au, Ag, Ti, Pd, W, solder, alloys or combinations of the same, as well as any other suitable electrically conductive material. The first steps 252a of conductive interconnects 252 can be formed using patterning and metal deposition processes such as printing, PVD, CVD, sputtering, electrolytic plating, electroless plating, metal evaporation, metal sputtering, or other suitable metal deposition process. When the first steps 252a are formed by plating, the seed layer 190 can be used as part of the plating process. First steps 252a can be one or more layers of electrically conductive material and can include one or more layers. A height of the first step 252a (e.g., about 95 μm target) may be less than a height of the first opening 250a in the first resist material 248a (e.g. about 110 μm). The first step of MSI 252a may comprise a first end $252a_1$ and a second end $252a_2$ opposite the first end $252a_1$. The first end $252a_1$ may be coupled to the first build-up interconnect structure 170, the first step 252a comprising a first height (Ha) defined by a distance between the first end $252a_1$ of the first step 252a and the second end $252a_2$ of the first step 252a and the first step 252a further comprising first diameter (Da) perpendicular to the first height Ha.

Figure 2D:
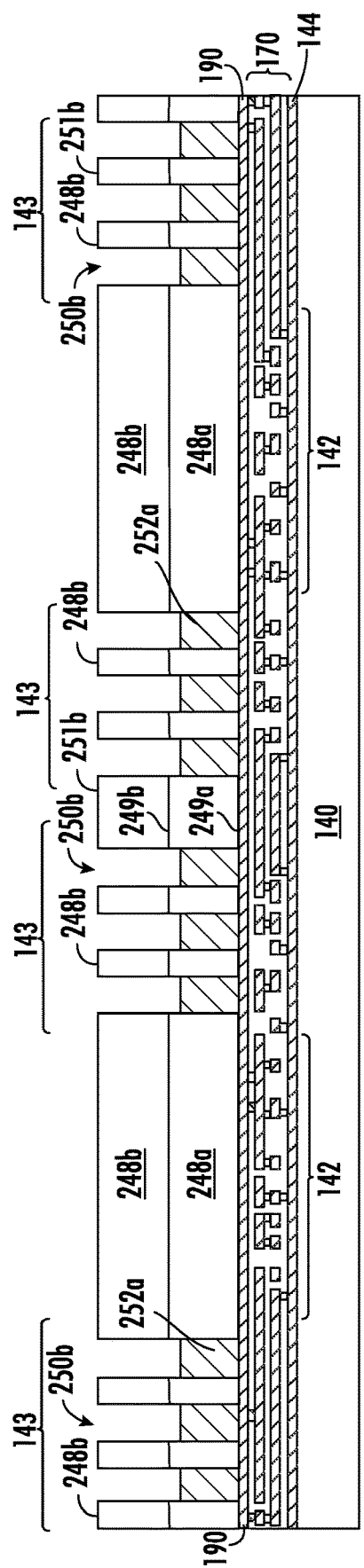

FIG. 2D continuing from FIG. 2C, shows a first option for further processing of a MSIs 252. FIG. 2D shows no strip and no seed etch of resist 248a after the formation of the first steps of MSIs 252a, as is done conventionally. Instead, after the formation of the first steps of MSIs 252a and before the removal of the first resist 248a, a second resist layer, dry film, or photosensitive layer 248b, may be disposed over the first layer of photoresist material and over the first step of conductive material and. Second resist 248b may be a same or similar material formed in a same or similar way as first resist. 248. Second resist 248b may comprise a thickness in a range of 80-140 μm, or about 110 μm. The openings 250b formed within second resist 248b may comprise a desirable height of depth, such as to form second MSI steps 252b with a height of about 80 μm and with a spacing or pitch of about 80 μm. Thus, the second layer of photoresist material 248b can comprise openings 250b in the second layer of photoresist material aligned with the first steps of MSIs 252a.

Figure 2E:
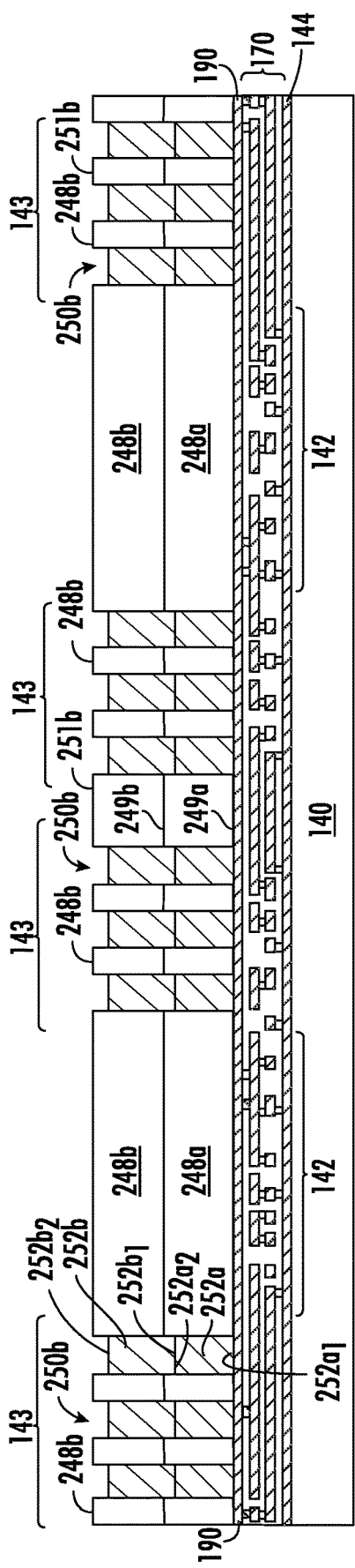

FIG. 2E shows forming second steps of a MSI 252b by plating or disposing conductive material within the second openings 250b in the second layer of photoresist material 248b. In some instances, the second steps of a MSI 252b may comprise heights of about 95 μm. The second steps of the MSI 252b may comprise first ends $252b_1$ and second end $252b_2$ opposite the first ends $252b_1$, wherein the first ends $252b_1$ of the second step 252b contact the second end $252a_2$ of the first step 252a and the second end $252b_2$ of the second step 252b contacts a second build-up interconnect structure 270 (as shown in FIG. 5D). The second step 252b may comprise a second height (Hb) defined by a distance between the first end $252b_1$ of the second step 252 and the second end $252b_2$ of the second step 252b and the second step 252b further comprising a second diameter (Db) perpendicular to the second height Hb.

Figure 2F:
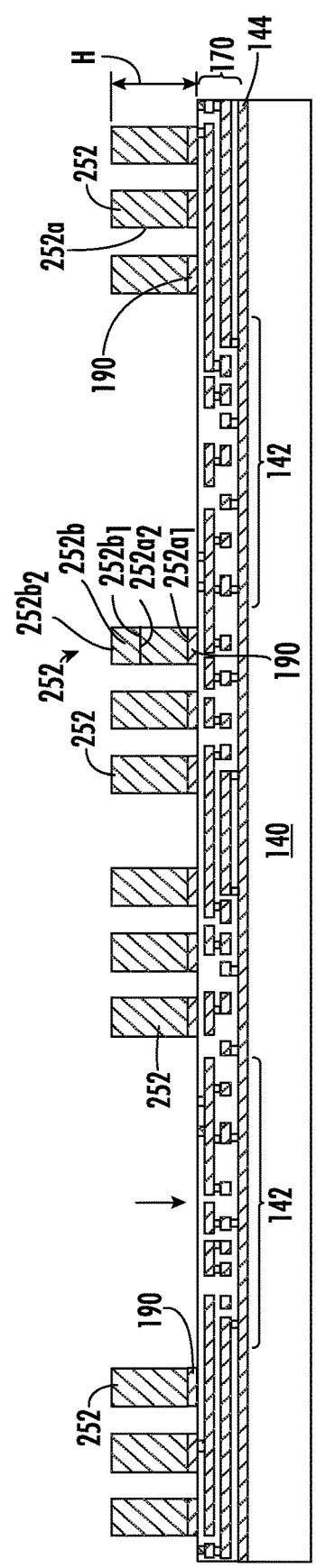

FIG. 2F illustrates that after formation of the conductive interconnects or MSI 252 (comprising two or more steps, such as first step 252a and second step 252b), the resist layer 248 (including first layer 248a and second layer 248b) can be removed, such as by a stripping process, leaving conductive interconnects 252 in the peripheral area 143 around the semiconductor die mounting sites 142 to provide for subsequent vertical or three dimensional (3D) electrical interconnection for the semiconductor device 300. Conductive interconnects 252 can include a height H in a range of about 80-300 μm or a height in a range of about 100-150 μm, or a height thereabout. In other instances, conductive vertical interconnects 252 may include a height H in a range of about 10-600 μm, 60-100 μm, 70-90 μm, or about, 80 μm. As used herein, "thereabout," "about," or "substantially" means a percent difference in a range of 0-5%, 1-10%, 1-20%, 1-30%, or 1-50% of the number or range indicated.

Figure 2G:
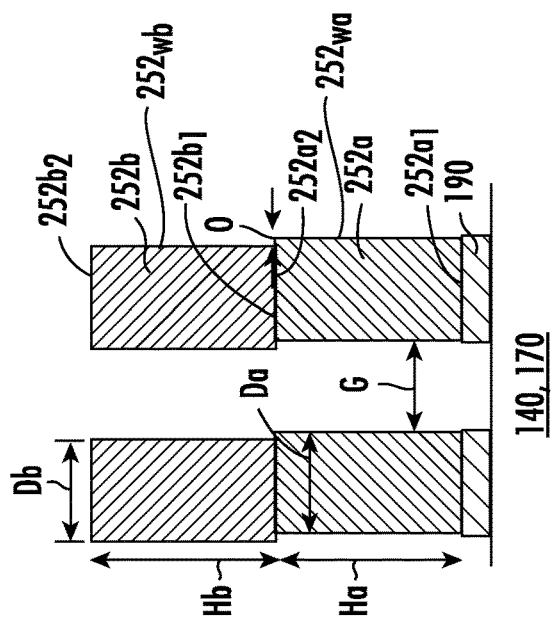
Figure 2H:
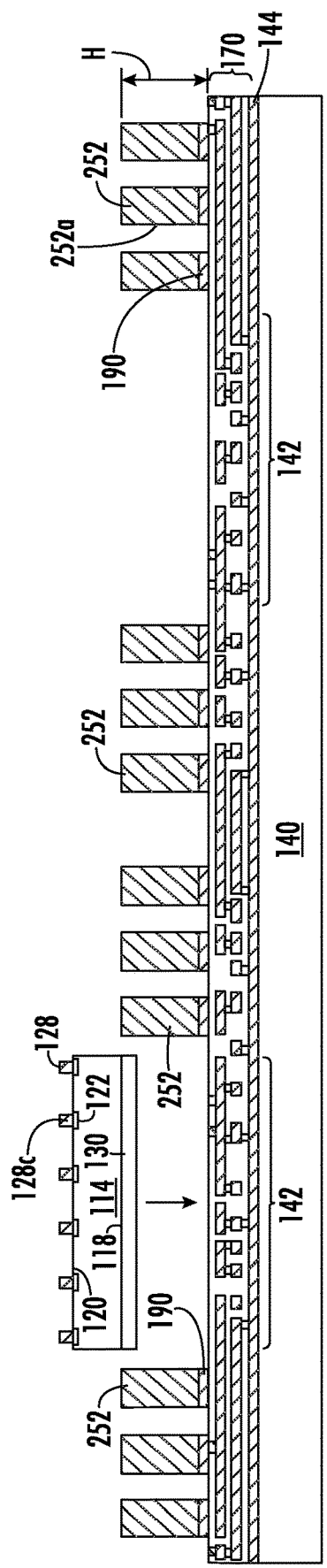

FIG. 2G illustrates an enlarged or close-up view of a MSI 252 formed over one or more of carrier 140 and build-up interconnect structure 170. The MSI 252 may comprise a height (H) that is a sum of the first step height Ha and the second step height Hb. The MSI 252 may comprise a height:width aspect ratio (H:Da) greater than or equal to 1.5:1. A sidewall $252w_1$ of the first step 252a comprises as offset (O) with respect to a sidewall $252w_2$ of the second step 252b at an interface between the second surface or end $252a_2$ of the first step 252a and the first surface or end $252b_1$ of the second step 252b, such that the offset O forms a disjointed sidewall profile, 252w wherein the offset O is in a range of 0.1 μm-20 μm. The first diameter Da of the first step 252a may comprise a distance in a range of 25-200 μm and spacing between the MSI and a proximately adjacent MSI at a distance of 25-200 μm to form a pitch or gap G between MSI 252 of 50-400 μm. A grain of the conductive material of the first step 252a may be mismatched with a grain of the conductive material of the second step 252b.

FIG. 2H illustrates after removal of the resist layer 248, the semiconductor die mounting sites 142 on or over the temporary carrier 140, the build-up interconnect structure 170, or both, can be exposed and ready to receive the semiconductor die 114. The orientation of semiconductor die 114 can be either face up with active surface 120 oriented away from the temporary carrier 140 to which the semiconductor die 114 are mounted. Alternatively, the orientation of semiconductor die 114 can be mounted face down with the active surface 120 oriented toward the temporary carrier 140 to which the semiconductor die 114 are mounted. After mounting the semiconductor die 114 to the temporary carrier 140 in a face up orientation, the DAF 130 can undergo a curing process to cure the DAF 130 and to lock the semiconductor die 114 in place to the build-up interconnect structure 170 and over the temporary carrier 140.

FIG. 2I, continuing from FIG. 2H, illustrates that after mounting the semiconductor die 114 to the carrier 140, a mold compound or encapsulant 256 can be deposited around the plurality of semiconductor die 114 using a paste printing, compression molding, transfer molding, liquid encapsulant molding, lamination, vacuum lamination, spin coating, or other suitable applicator. The encapsulant 256 can be a polymer composite material, such as epoxy resin with filler, epoxy acrylate with filler, PBO, polyimide, polymer with or without proper filler. Semiconductor die 114 can be embedded in encapsulant 256, which can be non-conductive and environmentally protect the semiconductor die 114 from external elements and contaminants as well as provide structural support. The encapsulant 256 can be formed as a single encapsulant in a single step adjacent to and directly contacting all lateral sides of the semiconductor die (such as four sides), as well as be formed over the active surface 120 of the semiconductor die 114 (a fifth side). The same single encapsulant 256 can also be formed around and directly contact the sides of the conductive studs 128 and the sidewalls 252w of conductive interconnects 252 in a single step to form at least part of a semiconductor device 300. The semiconductor device 300 may comprise one build-up interconnect structure 170, as shown in FIG. 4F, or may comprise two opposing build-up interconnect structures 170, 270, as illustrated in FIG. 5D. While a method is shown of forming build-up interconnect structure 170 first, followed by building build-up interconnect structure 270, the order may be reversed. In some instances, the encapsulation and frontside build-up interconnect structure 270 may be built first, followed by removal of the temporary carrier 140, and further followed by the formation of the backside build-up interconnect structure 170.

The molded panel 258 can optionally undergo a curing process or post mold cure (PMC) to cure the encapsulant 256. In some instances, a top surface, front surface, or first surface 262 of the encapsulant 256 can be substantially coplanar with first end 253 of the conductive interconnects 252. Alternatively, the top surface 262 of the encapsulant 256 can be over, offset, or vertically separated from the ends 253 (such as $252b_2$) of the conductive interconnects 252, such that the ends 253 of the conductive interconnects 252 are exposed with respect to the encapsulant 256 after the reconstituted wafer 258 undergoes a grinding operation, or through a recess 257 in the encapsulant 256 to expose the first end 253.

The molded panel 258 can also undergo an optional grinding operation with grinder 264 to planarize the top surface, front surface, or first surface 268 of the molded panel 258 and to reduce a thickness of the molded panel 258, and to planarize the top surface 262 of the encapsulant 256 and to planarize the top surface 268 of the molded panel 258. The top surface 268 of the molded panel 258 can comprise the top surface 262 of the encapsulant 256, the first ends of the conductive interconnects 252, or both. A chemical etch can also be used to remove and planarize the encapsulant 256 and the molded panel 258. Thus, the top surface 268 of the conductive interconnects 252 can be exposed with respect to encapsulant 256 in the peripheral area 143 to provide for electrical connection between semiconductor die 114 and a subsequently formed redistribution layer or build-up interconnect structure 170.

The reconstituted wafer 258 can also undergo a panel trim or trimming to
remove excess encapsulant 256 that has remained in undesirable locations as a result of a molding process, such as eliminating a flange present for a mold chase. The molded panel 258 can include a footprint or form factor of any shape and size including a circular, rectangular, or square shape, the reconstituted wafer 258 comprising a diameter, length, or width of, or about, 200 millimeter (mm), 300 mm, or any other desirable size.

Figure 3A:
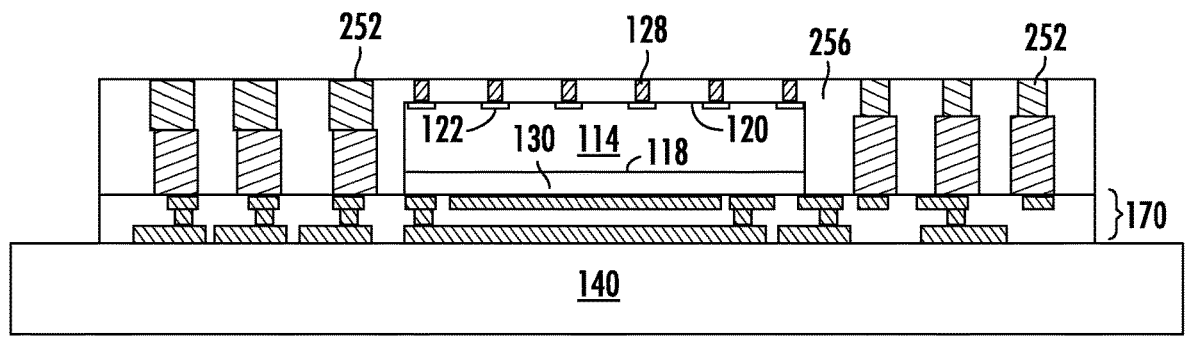
FIGS. 3A-3C illustrate various aspects of MSIs in both profile view and plan view.

FIG. 3A shows a cross-sectional profile view of a fully molded package in which the die 14 is surrounded by a number of a MSI 252 disposed around a periphery of the die 114. While a number of examples are described in which the MSI are discussed with respect to the die 114, the MSI 252 may also be advantageously used in other instances without the die 114. The structure of the device in FIG. 3A includes, for the purposes of illustration, a first type of MSI 252 on the left side of the molded package of FIG. 3A and a second type of MSI 252 on the right side of the molded package of FIG. 3A, each of which is discussed in greater detail below. In some instances, a package 300 may comprise a same type or style of MSI 252 throughout the package or application 300, while in other instances the package 300 may comprise multiple types or styles of MSI 252.

The MSI 252 on the left side of the molded package of FIG. 3A are MSI 252 in which the first lower step 252a of the MSI 252 and the second upper step 252b of the MSI 252 each comprise diameters D (Da and Db, respectively) or cross-sectional widths that are the same or about the same. The MSI 252 comprising diameters of about the same size are shown and discussed, e.g., in FIGS. FIGS. 2D-2I, 3A-3C, and 5D.

The MSI 252 on the right side of the molded package of FIG. 3A are MSI 252 in which the first lower step 252a of the MSI 252 and the second upper step 252b of the MSI 252 each comprise diameters or cross-sectional widths D of different sizes Da and Db respectively. The MSI 252 comprising diameters of different sizes are shown and discussed, for example, in FIGS. 3A and 4A-5C.

Figure 3B:
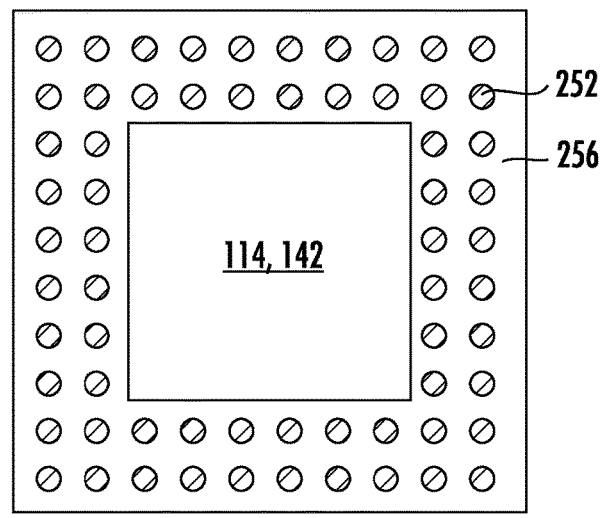

FIG. 3B shows a top or plan view of the fully molded package shown in FIG. 2I, or on the left side of FIG. 3A, with the MSI 252 disposed around a periphery of the die 114. While FIGS. 3B and 1C show a non-limiting example of two rows of MSI 252, any desirable number of rows of vertical interconnects 252, such as 1-6 rows of MSI 252, may be disposed around the periphery of the die 14.

Figure 3C:
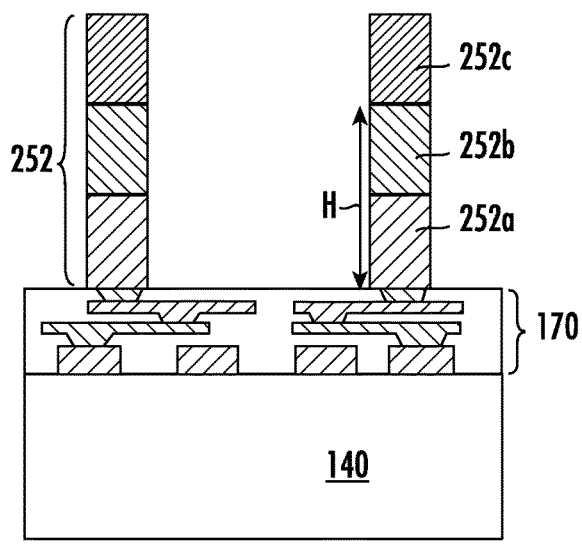

FIG. 3C illustrates a cross-sectional profile view in which multiple layers of the photoresist 248, such as the first layer 248a and the second layer 248b (and even a third layer) of photoresist material 248 may be removed (stripped and etched) together, or at a same time or as part of a same process, after having formed all the steps of the MSI 252, such as both the first steps 252a, the second steps 252b, and third steps 252c of MSI 252. A resulting MSI 252 may comprise a final plated height greater than a final height, which may be reduced in a grinding or planarization process. For example, a final plated height of or about 190 μm may be plated in order to have a final height of or about 135 μm. A total plated thickness or height H of 190 μm with a diameter D or width of 80 μm results in an aspect ratio of 2.4:1. While FIG. 3C illustrates the MSI 252 formed of three steps, the MSI may be formed of any desirable number of steps, such as 2, 3, 4, 5, 6 or more steps. When the device 300 comprises a micro-electromechanical system (MEMS) the height:diameter ratios may be even larger, and more desirable, the MSI 252 being formed of three steps or more.

By forming the MSI 252 and following the method described herein, a number of advantages may be achieved. Conventionally, thick photoresists are needed to support plating of Through Mold Vias (TMVs), which limit the linewidth or pitch capability of a Cu post, stud or pillar. The above is especially true when resist (liquid or dry film) are required to be thicker than the plated feature due to plate nonuniformity. Existing difficulties include: (i) thicker resist films being more difficult to image, and (ii) common photoresists having an imaging capability for aspect ratios (height to width ratios) ranging from 1:1 up to 1.5:1 or 1:1 up to 2:1 without a profile discontinuity. Conductive interconnects, such as copper pillars, typically range from 30 µm to 300 µm in thickness. When processing a thick photoresist, well-controlled sidewall angles are a critical requirement when electroplating tall interconnects, such as copper posts, studs, and pillars, which have not been achievable for aspect ratios of 2:1 or greater.

To overcome the above limitations and difficulties and to reach greater than 50 µm photoresist film thickness, two coatings of photoresist are typically required with a bake between coats, which results in a Coat→Bake→Coat→Bake and then expose, develop, plate and strip and etch process. With the intermediate bake (and additional processing time) a 120 um coat is possible with a 60 um pillar width or an aspect ratio of (2:1). To overcome the above limitations and difficulties another approach has been the Shinko MCeP process of using Cu Core Solder Ball as a TMV.

Instead, as described and shown herein, the current MSI approach provides advantages of width aspect ratios greater than 2:1 or greater than 1.5:1. Instead of coat-bake-coat-bake followed by exposure and develop, the current method provides for: a coat→bake→expose-→develop→plate and then no strip or etch and then recoat over existing resist layer→expose, develop and then another plate for an additional step in the MSI to reduce the aspect ratio by breaking the photo and plate steps into two or more parts. Breaking the photo and plate steps into two or more parts provides a benefit of supporting TMV (or MSI) pitch reduction on one side of a the TMV (or MSI) that can have a relaxed pitch on one side a finer pitch on the other side. An additional benefit is that higher aspect ratio vertical interconnects of greater 2:1, can be achieved, such as 2.4:1 and 4.7:1.

Accordingly, a critical dimension (CD) such as width, diameter, or profile may be improved for the vertical interconnect (e.g., Cu pillar, post, stud, or MSI 252) with the reduction in resist thickness 248 for the photolithography of the photoresist layers 248. High speed plating can be use in the first photoresist layer 248a with a slower speed in second photoresist layer 248b to improve uniformity. The routing capability on the fine pitch side at an RDL (such as within build-up interconnect structure 170 or 270) can be improved due to more space being present with the smaller diameter steps (e.g. 252b) of the MSI 252m as shown, for example, in FIGS. 4A-5C.

Figure 4A:
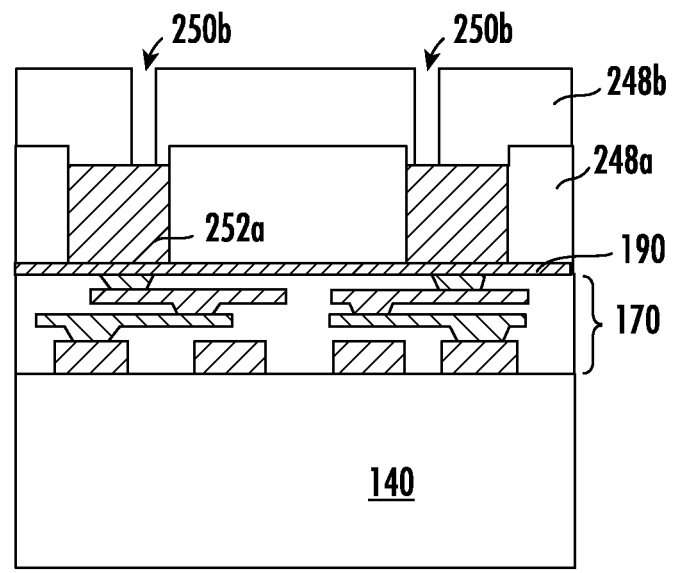
FIGS. 4A-4E illustrate various other aspects of MSIs in both profile view and plan view.

FIG. 4A, shows a second option for further processing of MSI 252 in which the steps of the MSI comprise different diameters. FIG. 4A may be understood as continuing from FIG. 2C, and showing an enlarged cross-section of a portion of FIG. 2C. FIG. 4A shows no strip and no seed etch of the first photoresist 248a, as done conventionally, and instead shows a second photoresist 248b formed over the first photoresist 248a and the first step 252a. In some instances, the second photoresist 248b comprise a thickness of about 40-80 µm, or about 56 µm. Openings 250b may formed within the second photoresist 248b with the openings facilitating a second step 252b height (Hb) of about 30-50 µm, or about 40 µm, and a second step 252b post diameter Db of about 20-40 µm or about 30 µm, and a pitch B of the second step 252b the MSI of about 40-60 µm or about 50 µm.

Figure 4B:
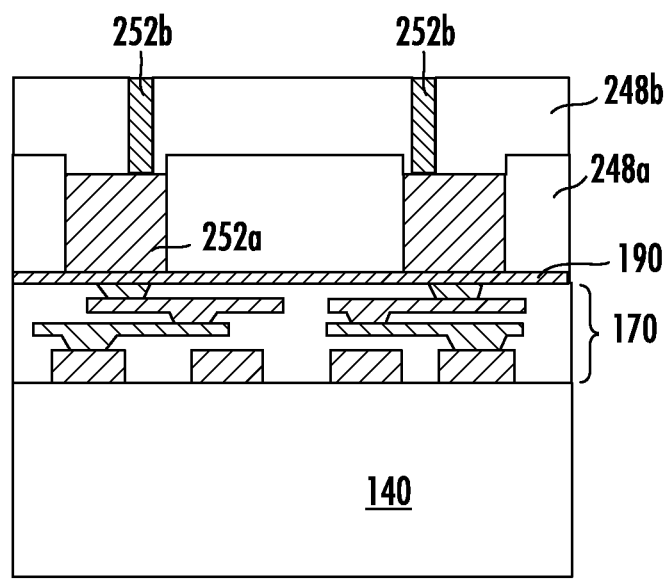

FIG. 4B shows the openings 250b formed in the second photoresist 248b being filled, such as by plating of conductive material, to form the second step 252b, such as with a height of about 40-60 µm or about 48 µm.

Figure 4C:
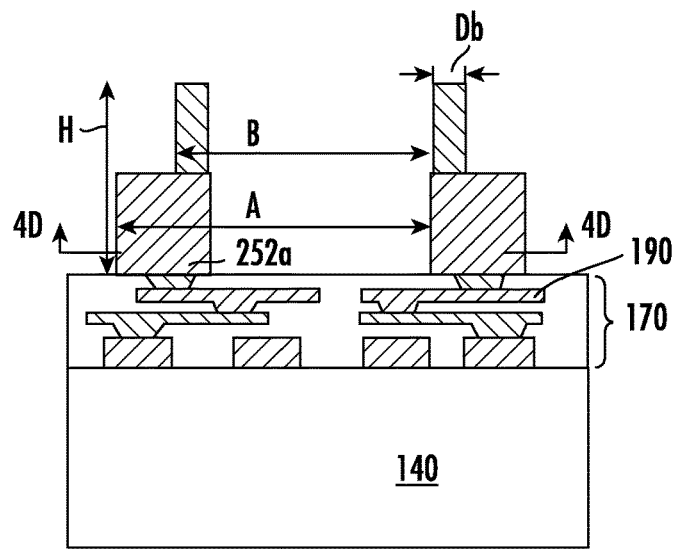

FIG. 4C shows stripping and etch of photoresist 248 with result that Pitch B is less than pitch A for the final MSI 252 structure, wherein the MSIs 252 may comprise a total plated thickness or height H of 142 µm at 30 µm width or diameter Da, and a resulting aspect ratio of 4.7:1. The pitch of A may be a standard pitch, such as for Cu posts, and the pitch of B may be a fine pitch.

Where more than two steps $252n$ within a MSI 252 are desirable, any number of additional steps $252n_{+1}$ may be included, including at least one other step to arrive at 3, 4, 5, 6, or more steps. For example, 4, 5, or 6 steps may be used to arrive at: (i) a pitch of less than or equal to 50 µm, (ii) a MSI 252 height greater than or equal to 200 µm, 300 µm or more, or (iii) both. In some instances, multiple vertically stacked die 114 may be included within a semiconductor device or package 300 and be electrically coupled or interconnected with each other, other devices, or both, through multiple steps $252n$ of the MSI 252.

The pitch B of the upper or second steps 252b of the MSI 252 may be at least 10 µm less than the pitch A or the pitch of the lower or first steps 252a of the MSI 252. Similarly, a pitch of second, top, or active side build-up interconnect structure 270 (and of an RDL formed therein) may be at least 10 µm less than the pitch A or of a first, bottom, or backside build-up interconnect structure 170 (and of an RDL formed therein). In either instance, a difference of at least 10 µm in pitch is greater than a dimension of an exposure overlay dimension in the photolithography process, and would therefore be a product of deliberate change in pitch through the MSI 252.

Figure 4D:
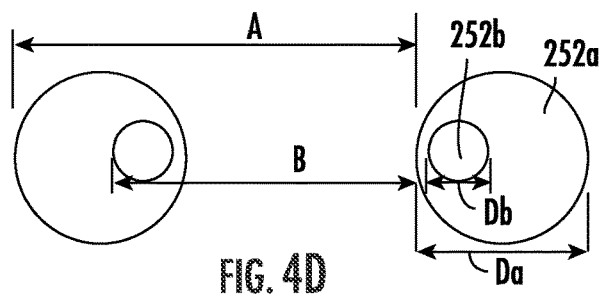

FIG. 4D illustrates a top or plan view of the MSI 252, which was shown previously in the side or profile view of FIG. 4C as taken along the section line 4D. FIG. 4D also illustrates the lower or first step 252a of the MSIs 252 shown with the larger pitch A, and the upper or second step 252b of the MSI 252 shown with the smaller pitch B. The pitch shrink illustrated in FIG. 4D provides for a smaller pitch or smaller device or semiconductor die on top, which corresponds to a higher density/routing with smaller bond pads, and is shown graphically with the smaller bond pad pitch B at the top of FIGS. 4C and 4D. Correspondingly, a first RDL in the first build-up interconnect structure 170 may comprise a first pitch; and a second RDL in the second build-up interconnect structure 270 may comprise second pitch that is at least 10 µm less than the first pitch.

Figure 4E:
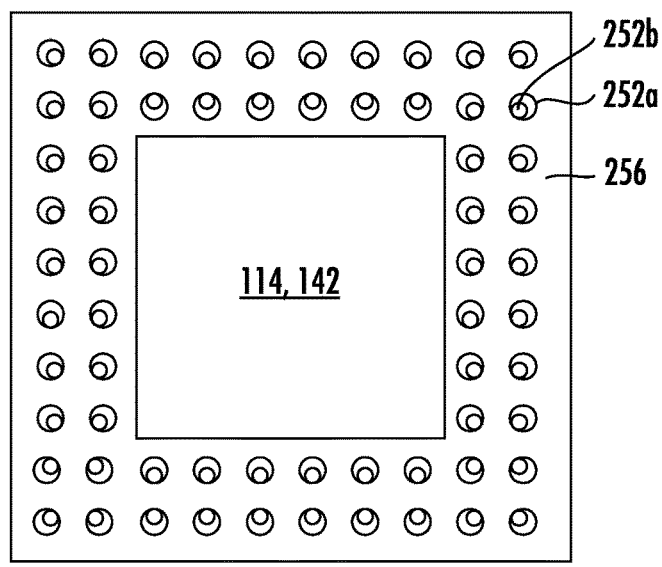

FIG. 4E shows another top or plan view of the fully molded package or device 300 shown in FIG. 3A or 5D. FIG. 4E differs from FIG. 3B in that the MSI disposed around the periphery 143 of the die 114 in FIG. 4E include first steps 252a and second steps 252b comprising different diameters, as shown, e.g., on the right of FIG. 3A, with. FIG. 4E shows the upper portion, lift, or step 252b of the MSI 252 as a smaller circle exposed at an outer or upper surface of the package 300. FIG. 4E further shows the lower portion, lift, or step 252a of the MSI 252 as a larger circle exposed at a lower outer surface of the package 300. The diameter Db of the upper step 252b of the MSI 252 is shown as being less than the diameter Da of the lower step 252a of the MSI 252.

Figure 5A:
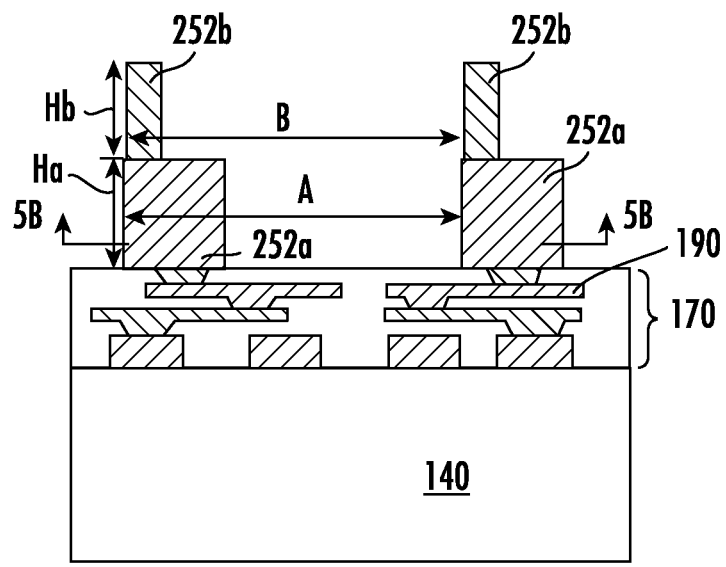
FIGS. 5A-5D illustrate various other aspects of MSIs in both profile view and plan view.
Figure 5B:
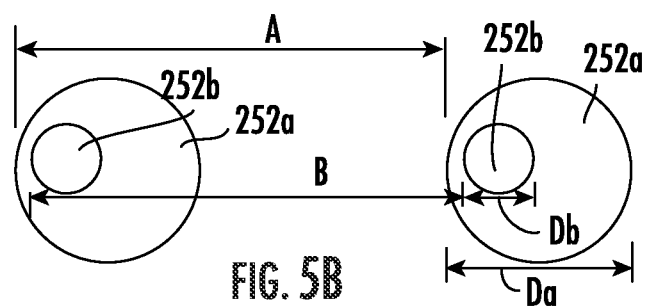
Figure 5C:
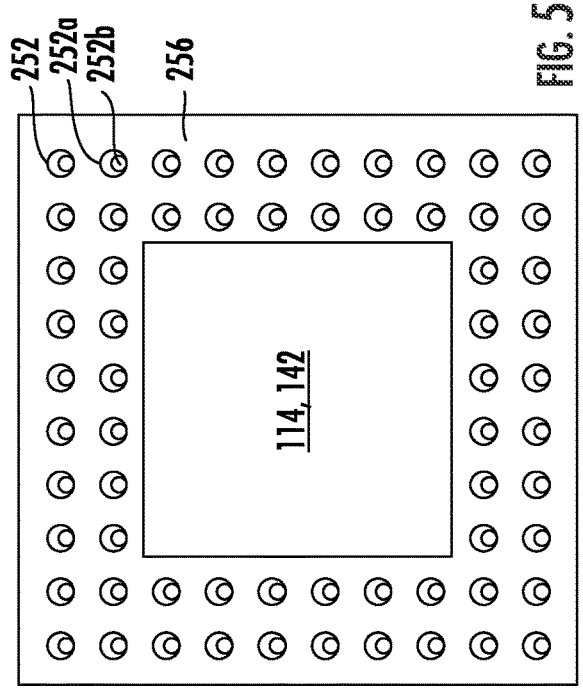
Figure 5D:
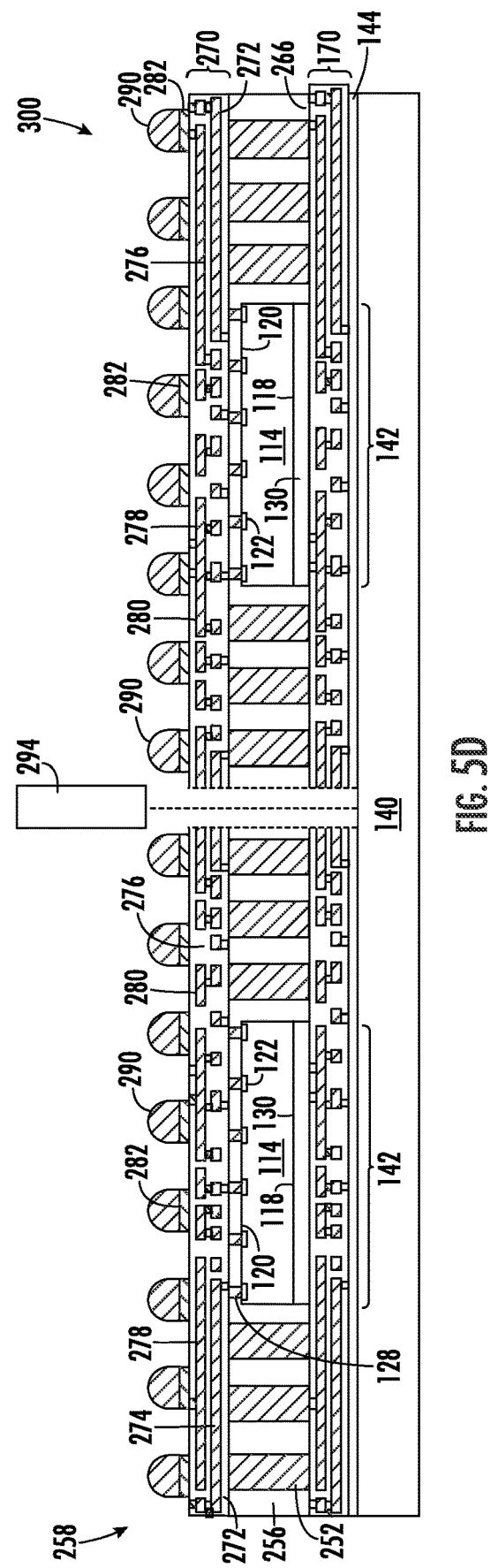

FIGS. 5A-5C, similar to FIGS. 4C-4E, show various views of the MSIs 252 in which the lower step 252a has a different diameter Da than the diameter Db of the upper step 252b. FIGS. 5A-5C differ from FIGS. 4C-4E in that the pitch pitches of A and B are the same, rather than different. FIG. 5A shows that the pitch A of the first step 252a is the same or substantially the same as the pitch B of the second step 252b. Such an arrangement may be advantageous when accounting for shift between the second MSI 252b and the first step 252a. The smaller Db may account for manufacturing tolerances. Additionally, a smaller diameter Db of the upper MSI 252b allows for the overlaid RDL of the second build-up interconnect structure 252b to also be smaller.

FIG. 5B shows a plan view of the MSIs 252 shown in cross-section in FIG. 5A, with the lower or first step 252b of the MSI 252 shown with the larger diameter Da and a same pitch A as the pitch B as the upper or second step 252b of the MSI 252 shown with the smaller diameter Db.

FIG. 5C illustrates another top or plan view of the fully molded package or device 300 shown in FIG. 3A or 5D. FIG. 5C differs from FIG. 4E in that the MSI 252 disposed around the periphery 143 of the die 114 in FIG. 4C include first steps 252a and second steps 252b comprising different the same pitch rather than a different pitch.

FIG. 5D, continuing from FIG. 2I, and comprising any of the MSIs 252 illustrated in FIGS. 3A-5C, illustrates second build-up interconnect structure 270 formed over the encapsulant 256 and the MSIs 252, similar to how build-up interconnect 170 was formed. A first (such as RDL 182) in the first build-up interconnect structure 170 may comprise a first pitch, and a second RDL (such as RDL 274) in the second build-up interconnect structure 270 may comprise second pitch that is at least 10 μm less than the first pitch. While the build-up interconnect structure 270 is shown comprising three conductive layers (274, 278, and 282) and three insulating layer (272, 276, and 280), a person of ordinary skill in the art will appreciate that fewer layers or more layers can be used depending on the configuration and design of the semiconductor device 300. The various layers of build-up interconnect structure 270 may correspond to, and be similar or identical to the various layers of build-up interconnect structure 170. More specifically, the first insulating layer 272, the second insulating layer 276, and the third insulating layer of build-up interconnect structure 270 may correspond to the first insulating layer 172, the second insulating layer 176, and the third insulating layer 176, respectively, of build-up interconnect structure 170. Similarly, the first conductive layer 274, the second conductive layer 278, and the third conductive layer 282 may correspond to the first conductive layer 174, the second conductive layer 178, and the third conductive layer 182, respectively, of build-up interconnect structure 170.

FIG. 5D further illustrates singulation of the molded panel 258 and build-up interconnect structures 170, 270 with saw blade or laser cutting tool 294 to form individual semiconductor device 300. The final semiconductor device 300 may be thinner than previous packages, comprising an overall height or thickness of, or on the order of, or about, 50-250, 100-200, or less than or about 150 μm. Stacks of multiple layers can be correspondingly thicker, and increase in multiples of the above ranges, resulting in an overall thickness in a range of 200-1,000 μm. As part of the reduced height of the structure, the final structure may be made without an interposer, comprising the build-up interconnect layers and conductive vertical providing the function of an interposer, and serving as s sort of embedded interposer.

Following FIG. 5D, the temporary carrier 140 may be removed to expose the build-up interconnect structure 170. The carrier 140 can be removed, e.g., by grinding the carrier 140, by exposing UV release tape 144 to UV radiation separate the UV tape 144 from the glass substrate 140, by thermal release, or other suitable method. After removal of the carrier 140, the molded panel 258 can also undergo an etching process, such as a wet etch, to clean the surface of the molded panel 258 exposed by removal of the temporary carrier 140, including the build-up interconnect structure 170. Exposed portions of the build-up interconnect structure 170 can also undergo a coating or pad finishing process, such as by an Organic Solderability Preservative (OSP) coating, solder printing, electroless plating, or other suitable process, to form a PoP UBM pad, UBM structures, land pads, or other suitable structure, as desired.

Bumps, balls, or interconnect structures 290 can be formed on or coupled to the build-up interconnect structure 270. Bumps, balls, or interconnect structures (similar to balls 290) can be formed on or coupled to the build-up interconnect structure 170, after removal of the carrier 140. The bumps 290 can be formed by depositing an electrically conductive bump material over the surface to which they will be attached using an evaporation, electrolytic plating, electroless plating, ball drop, or screen-printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded using a suitable attachment or bonding process. In one embodiment, the bump material is reflowed by heating the material above its melting point to form spherical balls or bumps 290. In some applications, bumps 290 are reflowed a second time to improve electrical contact to conductive interconnects 252. The bumps 290 can also be compression bonded or thermocompression bonded. Bumps 290 represent one type of interconnect structure that can be formed, and other desirable structures, such as conductive paste, stud bump, micro bump, or other electrical interconnects may also be used as desired.

While this disclosure includes a number of embodiments in different forms, the drawings and written descriptions present detail of particular embodiments with the understanding that the present disclosure is to be considered as an exemplification of the principles of the disclosed methods and systems, and is not intended to limit the broad aspect of the disclosed concepts to the embodiments illustrated. Additionally, it should be understood by those of ordinary skill in the art that other manufacturing devices and examples could be intermixed or substituted with those provided. In places where the description above refers to particular embodiments, it should be readily apparent that a number of modifications may be made without departing from the spirit thereof and that these embodiments and implementations may be applied to other technologies as well. Accordingly, the disclosed subject matter is intended to embrace all such alterations, modifications and variations that fall within the spirit and scope of the disclosure and the knowledge of one of ordinary skill in the art.

What is claimed is:

1. A multi-step conductive interconnect (MSI), comprising:
   a first step of the MSI formed without a pad and comprising a first end and a second end opposite the first end, wherein the first end is coupled to a first build-up interconnect structure, the first step comprising a first height (Ha) defined by a distance between the first end of the first step and the second end of the first step and the first step further comprising a first diameter (Da) perpendicular to the first height Ha; and a second step of the MSI formed without a pad and comprising a first end and a second end opposite the first end of the second step, wherein the first end of the second step contacts the second end of the first step and the second end of the second step contacts a second build-up interconnect structure, the second step comprising a second height (Hb) defined by a distance between the first end of the second step and the second end of the second step and the second step further comprising a second diameter (Db) perpendicular to the second height Hb;

wherein the MSI is formed without a pad disposed between the first step of the MSI and the second step of the MSI;

wherein the MSI comprises a height (H) that is a sum of the first step height Ha and the second step height Hb, and the MSI comprises a height:width aspect ratio (H:Da) greater than or equal to 1.5:1; and wherein a sidewall of the first step comprises an offset (0) with respect to a sidewall of the second step at an interface between the second surface of the first step and the first surface of the second step, such that the offset forms a disjointed sidewall profile, wherein the offset O is in a range of 0.1 µm-20 µm.

2. The MSI of claim 1, wherein the first diameter Da comprises a distance in a range of 25-100 µm and spacing between the MSI and a proximately adjacent MSI at a distance of 25-100 µm to form a pitch between MSI of 50-400 µm.

3. The MSI of claim 1, further comprising at least one more step formed over and coupled to the second end of the second step.

4. The MSI of claim 1, wherein a grain of a conductive material of the first step is mismatched with a grain of a conductive material of the second step.

5. The MSI of claim 1, further comprising:
a first redistribution layer (RDL) in the first build-up interconnect structure comprising a first pitch; and
a second RDL in the second build-up interconnect structure comprising a second pitch that is at least 10 µm less than the first pitch.

6. The MSI of claim 1, wherein:
the height H of the MSI is in a range of 50-300 µm; and
the diameter Da is in a range of 25-100 µm.

7. A multi-step conductive interconnect (MSI), comprising:
a first step of the MSI formed without a pad and comprising a first end and a second end opposite the first end, a first height (Ha) and a first diameter (Da); and
a second step of the MSI formed without a pad and comprising a first end and a second end opposite the first end of the second step, wherein the first end of the second step contacts the second end of the first step, the second step comprising a second height (Hb) and a second diameter (Db);
wherein the MSI is formed without a pad disposed between the first step of the MSI and the second step of the MSI;
wherein the MSI comprises a height (H) and a height:width aspect ratio (H:Da) greater than or equal to 1.5:1; and wherein a sidewall of the first step comprises an offset (0) with respect to a sidewall of the second step to form a disjointed sidewall profile, wherein the offset O is in a range of 0.1 µm-20 µm.

8. The MSI of claim 7, wherein the first diameter Da comprises a distance in a range of 25-200 µm and spacing between the MSI and a proximately adjacent MSI at a distance of 25-200 µm to form a pitch between MSI of 50-400 µm.

9. The MSI of claim 7, further comprising at least one more step formed over and coupled to the second end of the second step.

10. The MSI of claim 7, wherein a grain of a conductive material of the first step is mismatched with a grain of a conductive material of the second step.

11. The MSI of claim 7, further comprising:
a first redistribution layer (RDL) comprising a first pitch and coupled to the first step; and
a second RDL comprising a second pitch that is at least 10 µm less than the first pitch, the second RDL being coupled with the second step.

12. The MSI of claim 7, wherein:
the height H of the MSI is in a range of 50-300 µm; and
the diameter Da is in a range of 25-100 µm.

13. The MSI of claim 7, wherein the diameter Db of the second step is less than or equal to half the diameter Da of the first step.

14. A multi-step conductive interconnect (MSI), comprising:
a first step of the MSI formed without a pad and comprising a first end and a second end opposite the first end, a first height (Ha) and a first diameter (Da); and
a second step of the MSI formed without a pad and comprising a first end and a second end opposite the first end of the second step, wherein the first end of the second step contacts the second end of the first step, the second step comprising a second height (Hb) and a second diameter (Db);
wherein the MSI is formed without a pad disposed between the first step of the MSI and the second step of the MSI; and
wherein a sidewall of the first step comprises an offset (O) with respect to a sidewall of the second step to form a disjointed sidewall profile, wherein the offset O is in a range of 0.1 µm-20 µm.

15. The MSI of claim 14, wherein the first diameter Da comprises a distance in a range of 25-200 µm and spacing between the MSI and a proximately adjacent MSI at a distance of 25-200 µm to form a pitch between MSI of 50-400 µm.

16. The MSI of claim 14, further comprising at least one more step formed over and coupled to the second end of the second step.

17. The MSI of claim 14, wherein a grain of a conductive material of the first step is mismatched with a grain of a conductive material of the second step.

18. The MSI of claim 14, further comprising:
a first redistribution layer (RDL) comprising a first pitch and coupled to the first step; and
a second RDL comprising a second pitch that is at least 10 µm less than the first pitch, the second RDL being coupled with the second step.

19. The MSI of claim 14, wherein:
the height H of the MSI is in a range of 50-300 µm; and
the diameter Da is in a range of 25-100 µm.

* * * * *